United States Patent [19]

Lee et al.

[11] Patent Number: 5,893,736
[45] Date of Patent: Apr. 13, 1999

[54] METHODS OF FORMING INSULATED GATE SEMICONDUCTOR DEVICES HAVING SPACED EPITAXIAL JFET REGIONS THEREIN

[75] Inventors: Sang-yong Lee, Kyungki-do; Soo-seong Kim, Seoul, both of Rep. of Korea

[73] Assignee: Samsung Electronics Co., Ltd., Suwon, Rep. of Korea

[21] Appl. No.: 08/722,839

[22] Filed: Sep. 27, 1996

[30] Foreign Application Priority Data

Oct. 10, 1995 [KR] Rep. of Korea .................. 95-34700

[51] Int. Cl.$^6$ .................. H01L 21/8236; H01L 21/28
[52] U.S. Cl. .................. 438/271; 438/586; 438/589
[58] Field of Search .................. 257/335, 339, 257/341

[56] References Cited

U.S. PATENT DOCUMENTS

| | | | |
|---|---|---|---|
| 4,587,713 | 5/1986 | Goodman et al. | 257/335 |
| 4,680,853 | 7/1987 | Lidow et al. | 29/571 |
| 5,016,066 | 5/1991 | Takahashi | 257/339 |
| 5,233,215 | 8/1993 | Baliga | 257/490 |
| 5,598,018 | 1/1997 | Lidow et al. | 257/342 |

OTHER PUBLICATIONS

B. Jayant Baliga, *Power MOSFET*, Chapter 7, Power Semiconductor Devices, Jan. 1996, pp. 367–372.
Daisuke Ueda et al., *Deep–Trench Power MOSFET With An Ron Area Product Of 160 m$\Omega$ mm$^2$*, IEDM, 28.2, 1986, pp. 638–641., Dec. 1986.

*Primary Examiner*—John F. Niebling
*Assistant Examiner*—Michael S. Lebentritt
*Attorney, Agent, or Firm*—Myers Bigel Sibley & Sajovec

[57] ABSTRACT

An insulated gate semiconductor device includes a relatively highly doped epitaxial JFET region. The epitaxial JFET region forms a P-N junction with the base region of the device, but is spaced from the insulated gate electrode by a more lightly doped epitaxial accumulation region. The use of a spaced JFET region provides a number of important performance advantages over prior art power MOSFETs or IGBTs. By spacing the highly doped JFET region from the top face, the devices of the present invention are, among other things, capable of sustaining higher breakdown voltages without a significant increase in forward on-state resistance. For example, by using a more lightly doped accumulation region underneath the gate electrode, in place of a more highly doped JFET region, the punch-through voltage of the device is increased and electric field crowding at the base junction at the top of the face is decreased. In contrast to those JFET regions in the prior art which are formed by performing a high dose implant and/or high dose diffusion of first conductivity type dopants, the devices according to the present invention reduce the adverse influences on threshold voltage caused by high dose implants of ions adjacent the periphery of the base regions.

11 Claims, 2 Drawing Sheets

METHODS OF FORMING INSULATED GATE SEMICONDUCTOR DEVICES HAVING SPACED EPITAXIAL JFET REGIONS THEREIN

FIELD OF THE INVENTION

The present invention relates to semiconductor devices, and more particularly to insulated gate semiconductor devices and methods of forming same.

BACKGROUND OF THE INVENTION

A critical parameter in the design of insulated gate semiconductor devices such as insulated gate field effect transistors (e.g., MOSFETs) and insulated gate bipolar transistors (IGBTs) is the forward on-state resistance because it determines the maximum current rating of the device. With respect to power MOSFETs, the on-state resistance is the total resistance between the source and drain terminals during forward conduction. This total resistance can be determined by summing the resistance contributions of the MOSFET's source region, channel region, accumulation region (which accounts for current spreading), JFET region, drift region and drain/substrate region. Determination of the total resistance for DMOS-type power MOSFETs is more fully described and illustrated in section 7.4.4 of a textbook by B. J. Baliga entitled *Power Semiconductor Devices*, PWS Publishing Co. (ISBN 0-534-94098-6) (1995).

However, while it may be advantageous to reduce the resistance of each of these regions to minimize forward on-state resistance, the resistance of the drift region generally cannot be minimized without significantly reducing the breakdown voltage of the device. Thus, to reduce on-state resistance, attempts have typically focused on reducing the resistance of the JFET and accumulation region by doping both these regions to relatively high levels. For example, U.S. Pat. No. 4,680,853 to Lidow et al. discloses a power MOSFET having a highly doped JFET and accumulation region 130 which is formed by performing a blanket implant of phosphorus ions at a dose in the range of $1 \times 10^{11}$ to $1 \times 10^{14}$ atoms/cm$^2$. Unfortunately, such blanket implant can reduce the punch-through voltage of the devices, adversely effect the characteristics of the channel region and reduce control over obtaining preselected threshold voltages. A prior art power MOSFET which is similar to FIG. 22 of the '853 patent to Lidow et al. is disclosed at FIG. 1. This power MOSFET includes a drain region 10, drift region 20, accumulation region 100 and JFET region 200 (shown collectively as region 22), base region 50, source region 52, source contact 72, drain contact 74 and insulated gate electrode (regions 60–80). FIG. 3A also discloses a prior art substrate which can be used to form the device of FIG. 1.

Thus, notwithstanding the above described attempts to improve performance of insulated gate semiconductor devices such as power MOSFETs, there continues to be a need for devices which have both low on-state resistance and high punch-through and breakdown voltages and can be formed without loss of control over device threshold voltage.

SUMMARY OF THE INVENTION

It is therefore an object of the present invention to provide improved insulated gate semiconductor devices for high power applications, and methods of forming same.

It is another object of the present invention to provide insulated gate semiconductor devices having high punch-through and breakdown voltages and low on-state resistance, and methods of forming same.

These and other objects, features and advantages of the present invention are provided by an insulated gate semiconductor device, such as a power MOSFET or IGBT, which contains a relatively highly doped epitaxial JFET region. The epitaxial JFET region forms a P-N junction with the base region of the device, but is spaced from the insulated gate electrode by a more lightly doped epitaxial accumulation region. The use of a spaced JFET region provides a number of important performance advantages over prior art power MOSFETs or IGBTs. In particular, by spacing the highly doped JFET region from the top face, the devices of the present invention are capable of sustaining higher breakdown voltages without a significant increase in forward on-state resistance. For example, by using a more lightly doped accumulation region underneath the gate electrode, in place of a more highly doped JFET region, the punch-through voltage of the device may be increased and electric field crowding at the base junction at the top of the face may be decreased. In addition, in contrast to those JFET regions in the prior art which are formed by performing a high dose implant and/or high dose diffusion of first conductivity type dopants, the devices according to the present invention reduce the adverse influences on threshold voltage caused by these high dose implants of ions adjacent the periphery of the base regions.

The devices of the present invention are also preferably formed using epitaxial growth techniques to form the spaced JFET region of first conductivity type on a drift region of first conductivity type and then forming a more lightly doped epitaxial accumulation region of first conductivity type on the epitaxial JFET region. After the spaced JFET region has been formed, the base region of second conductivity type is formed in the epitaxial accumulation and JFET regions and then an insulated gate electrode is formed on the epitaxial accumulation region. The reduce the likelihood of parasitic thyristor latch-up in the event the device is an insulated gate bipolar transistor, the base region is formed to have a more highly doped deep base region which extends laterally underneath subsequently formed source regions. This reduces the lateral resistance in the base region and thereby reduces the likelihood of turn-on of the P-N junction formed between the source regions and the base region.

According to alternative embodiments of the present invention, formation of the more highly doped deep base region may be commenced prior to formation of the epitaxial accumulation region or thereafter.

DESCRIPTION OF PREFERRED EMBODIMENTS

Figure 1:
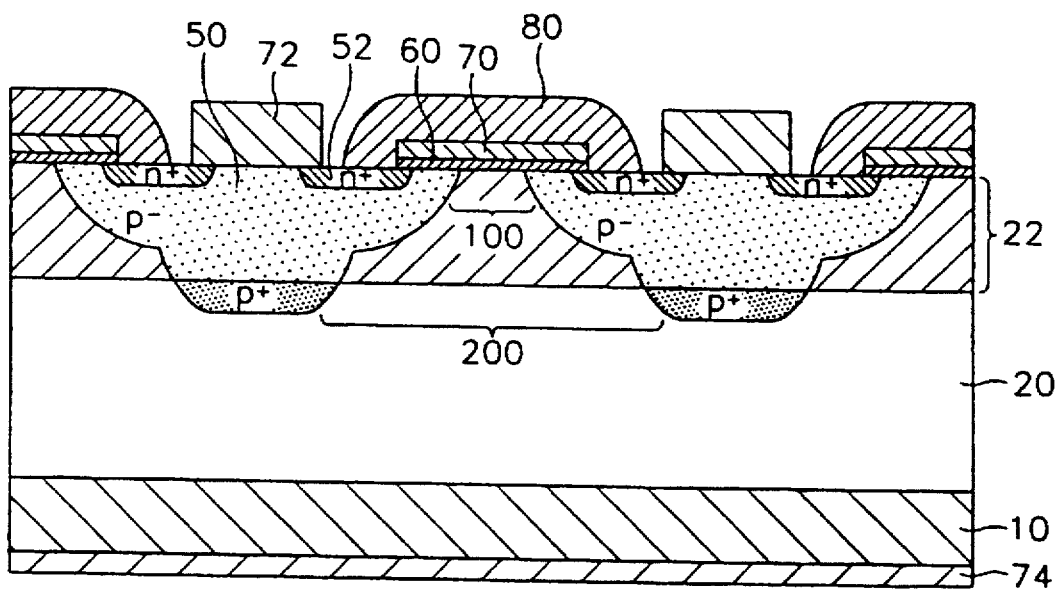
FIG. 1 illustrates a cross-sectional representation of a prior art insulated gate field effect transistor.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Moreover, the terms "first conductivity type" and "second conductivity type" refer to opposite conductivity types such as N or P-type, however, each embodiment described and illustrated herein includes its complementary embodiment as well.

Figure 2:
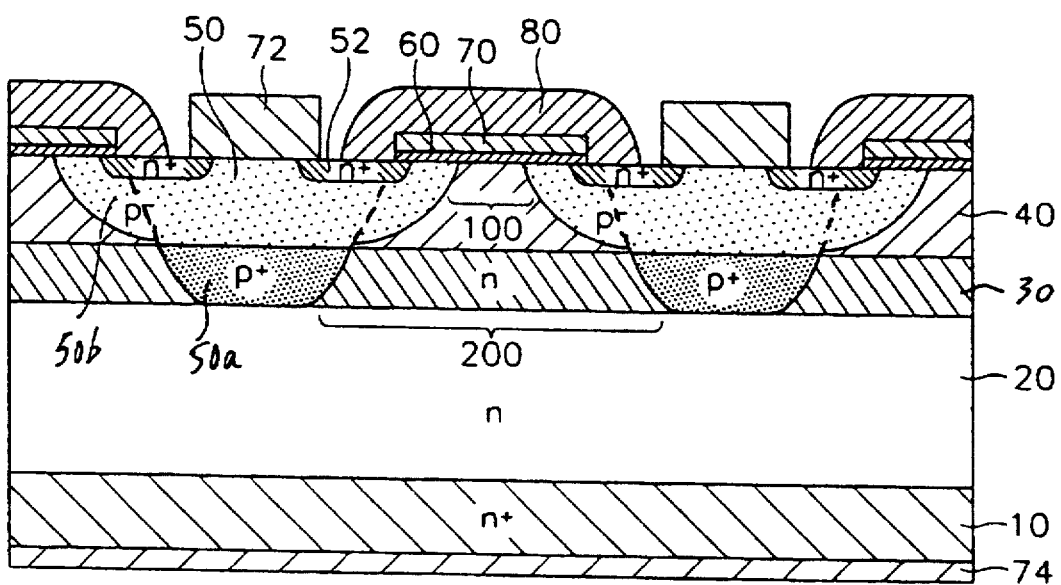
FIG. 2 illustrates a cross-sectional representation of an insulated gate field effect transistor according to a first embodiment of the present invention.
Figure 3A:
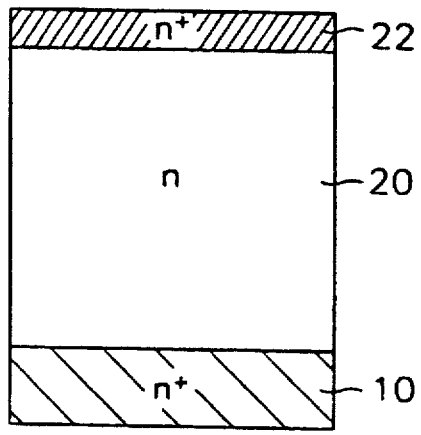
FIG. 3A illustrates a cross-sectional representation of a semiconductor substrate according to the prior art.
Figure 3B:
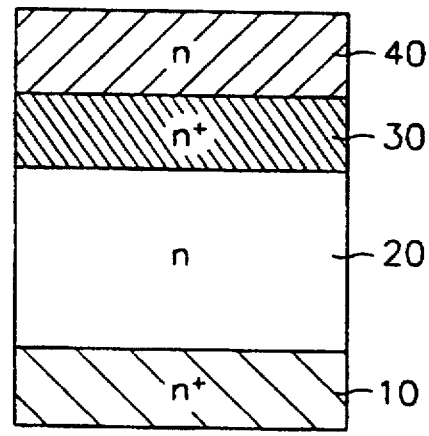
FIG. 3B illustrates a cross-sectional representation of a semiconductor substrate according to the present invention.
Figure 4:
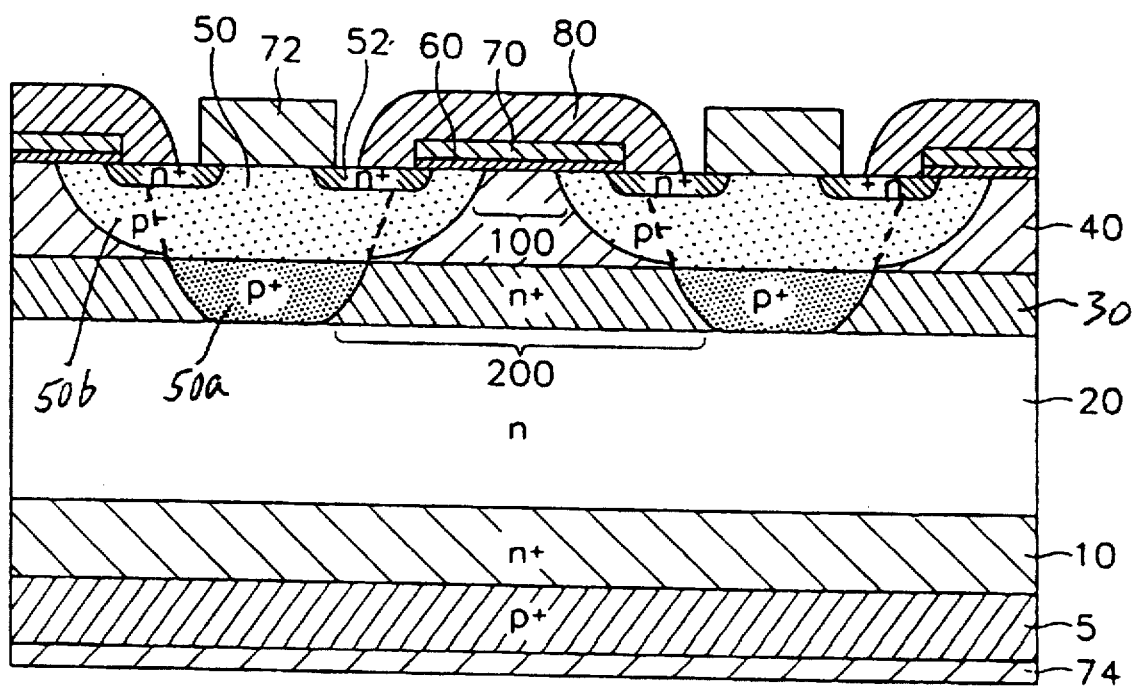
FIG. 4 illustrates a cross-sectional representation of an insulated gate bipolar transistor according to a second embodiment of the present invention.

Referring now to FIGS. 2–4, the present invention will be described. In particular, FIGS. 2 and 4 are cross-sectional illustrations of an insulated gate field effect transistor and insulated gate bipolar transistor, according to the present invention. FIG. 3B is a cross-sectional illustration of a composite semiconductor substrate containing a substrate region 10 of first conductivity type (e.g., N-type) and three regions or layers 20, 30 and 40 of first conductivity type formed on the substrate region 10. As described more fully hereinbelow with respect to FIGS. 2 and 4, the three regions may comprise an epitaxial drift region 20, an epitaxial JFET region 30 and an epitaxial accumulation region 40. These regions may be doped in-situ to different levels during epitaxial growth so that the epitaxial drift region 20 has a lower first conductivity type doping concentration therein than the substrate region 10, the epitaxial JFET region 30 has a higher first conductivity type doping concentration therein than the drift region 20 and the epitaxial accumulation region 40 has a lower first conductivity type doping concentration therein than the epitaxial JFET region 30.

Alternatively, the drift region 20 may constitute a first conductivity type region or substrate having top and bottom faces, with the epitaxial JFET region 30 and epitaxial accumulation region 40 being formed on the top face and the lowermost substrate region 10 being epitaxially formed on the bottom face. The lowermost substrate region 10 may also be formed by performing a blanket ion-implant of first conductivity type dopants into the bottom face of the drift region 20, followed by diffusion of the implanted dopants. For the sake of clarity, the composite semiconductor substrate containing regions 10–40 will be referred to as "substrate" and the substrate region 10 will be referred to as the drift/buffer region 10, depending on whether the insulated gate field effect transistor of FIG. 2 is being described or the insulated gate bipolar transistor of FIG. 4 is being described.

Referring now specifically to FIG. 2, an insulated gate field effect transistor is shown having a relatively highly doped first conductivity type drain region 10, a relatively lightly doped drift region 20 (which may be epitaxially formed on the drain region 10), a relatively highly doped and highly conductive JFET region 30 on the drift region 20 and a moderately doped accumulation region 40 on the JFET region 30. The JFET region 30 and accumulation region 40 are preferably formed from a top face of the drift region 20 using epitaxial growth and in-situ doping techniques.

According to one embodiment of the present invention, once epitaxial growth of the JFET region 30 has been completed, a top face of the JFET region 30 is patterned with a mask (not shown) so that formation of a plurality of deep base regions 50a (shown as P+) may be initiated. Formation of the deep base regions 50a can be initiated by performing a shallow implant of second conductivity type dopants and then, if necessary, partially diffusing the implanted dopants towards the junction between the JFET region 30 and drift region 20. Following formation of the deep base regions 50a, epitaxial growth and in-situ doping of the accumulation region 40 is performed so that the accumulation region 40 has a lower first conductivity type doping concentration therein relative to the epitaxial JFET region 30. During this step, additional diffusion of the deep base dopants typically occurs. Growth of the epitaxial accumulation region 40 is then followed by the formation of a plurality of shallow base regions 50b of second conductivity type in the epitaxial accumulation region 40. The shallow base regions 50b can be formed by patterning a mask on a top face of the epitaxial accumulation region 40 and then performing a shallow implant of second conductivity type dopants into the top face and then diffusing the implanted dopants towards the junction between the accumulation region 40 and JFET region 30. During this step, additional diffusion of the deep base dopants typically occurs.

Alternatively, corresponding pairs of deep base regions 50a and shallow base regions 50b, which collectively form respective base regions 50, can be formed after formation of the epitaxial accumulation region 40, using conventional techniques. For example, after the substrate of FIG. 3B has been formed, the top face of the epitaxial accumulation region 40 can be patterned with a first mask and then a high concentration of second conductivity type dopants can be implanted into the top face and then partially diffused to initiate formation of the highly doped central deep base regions 50a. The top face of the epitaxial accumulation region 40 can then be patterned with a second mask and then a lighter concentration of second conductivity type dopants can be implanted into the top face to initiate formation of the wider shallow base regions 50b. The shallow base region dopants and deep base region dopants can then be simultaneously diffused so that the deep base regions 50a extend into the epitaxial JFET region 30 and the shallow base regions 50b extend into the epitaxial accumulation region 40, as illustrated. Using this latter more preferred double diffusion technique, the shallow base regions 50b contain more highly doped central base regions shown by the dotted lines. As will be understood by those skilled in the art, these more highly doped central base regions extend to the top face and cause a reduction in the lateral resistance of the base regions 50. This inhibits parasitic transistor turn-on and parasitic thyristor latch-up as more fully described hereinbelow.

After the substrate and base regions 50 have been formed, at least one source region 52 is formed in each base region 50 by patterning the top face of the epitaxial accumulation region 40 and then implanting and diffusing source region dopants of first conductivity type. The source regions may be of annular (e.g., ring, square or hexagonal), stripe or similar shape extending in a third dimension (not shown). In addition, although the base regions 50 are shown as separate regions when viewed in transverse cross-section, the base regions 50 may comprise a single base region at the top face of the epitaxial accumulation region, with first conductivity type pedestals extending therethrough (shown as accumulation region 100).

Conventional techniques can also then be used to form an insulated gate electrode, comprising a gate oxide 60, gate electrode 70 and surrounding gate insulating region 80 (e.g., SiO$_2$), on the top face of the epitaxial accumulation region 40. The insulated gate electrode preferably extends opposite the source regions 52, shallow base regions 50b and accumulation region 100 so that upon application of an appropriate gate bias, first conductivity type inversion layer channels can be formed in the shallow base regions 50b, at the top face. As will be understood by those skilled in the art, these first conductivity type inversion layer channels electrically connect the source regions 52 to the accumulation region 100 and provide the forward turn-on current for the field effect transistor of FIG. 2 or the base-drive current for the insulated gate bipolar transistor of FIG. 4. The use of the term "accumulation" to describe region 100 is appropriate because upon application of the appropriate gate bias (e.g., positive), first conductivity type charge carriers "accumulate" in the first conductivity type region located between adjacent base regions 50, at the top face of the substrate. The insulated gate field effect transistor of FIG. 2 is then completed by forming a source electrode 72 on the top face, in ohmic contact with the source regions 52 and base regions 50, as illustrated, and forming a drain electrode 74 on the bottom face of the substrate, in ohmic contact with the drain region 10.

According to a preferred aspect of the present invention, the relatively highly doped epitaxial JFET region 30 is spaced from the top face of the substrate by a more lightly doped epitaxial accumulation region 40.

The use of a spaced JFET region 30 (shown as region 200 extending between adjacent base regions 50) provides a number of important advantages over the subject matter of U.S. Pat. No. 4,680,853 to Lidow et al., which discloses a power MOSFET having a JFET region abutting the top face. In particular, by eliminating the formation of a highly doped JFET region adjacent the top face, the present invention is capable of sustaining higher breakdown voltages because the more lightly doped accumulation region causes an increase in punch-through voltage and reduction in electric field crowding at the top face. Moreover, with respect to those JFET regions in the prior art which are formed by performing a high dose implant and/or diffusion of first conductivity type dopants, the present invention is capable of reducing adverse influences on threshold voltage caused by these high dose implants of ions adjacent the periphery of the shallow base regions 50b.

Referring now to FIG. 4, an insulated gate bipolar transistor according to the present invention will be described. The device of FIG. 4 is similar to the device of FIG. 2, however a region 5 of second conductivity type is provided adjacent the bottom face of substrate. This region 5 is sometimes referred to as an anode region, but is more correctly referred to as an emitter region because this region 5 constitutes the emitter of the vertical bipolar transistor having a floating base in the buffer region 10 and drift region 20 and a collector in the base region 50. The contact 74 also constitutes an anode or emitter contact. As will be understood by those skilled in the art, the use of a more highly doped deep base region 50a which extends laterally beneath the source regions 52 as shown by dotted lines, reduces the lateral resistance of the base region 50. Accordingly, the likelihood of parasitic latch up of the P-N-P-N thyristor formed by regions (5, 10-40, 50 and 52) is reduced by reducing the likelihood that the P-N junction formed between the base region 50 and source region 52 will become forward biased during forward conduction, when the base region 50 is acting as a collector.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an insulated gate semiconductor device, comprising the steps of:

epitaxially forming an in-situ doped JFET region of first conductivity type on a drift region of first conductivity type, said JFET region having a higher net first conductivity type doping concentration therein than said drift region;

epitaxially forming an in-situ doped accumulation region of first conductivity type on said JFET region, said accumulation region having a lower net first conductivity type doping concentration therein than said JFET region which is achieved without compensating all of said accumulation region by adding dopants of second conductivity type thereto;

forming a base region of second conductivity type and a source region of first conductivity type in said accumulation region; and forming an insulated gate electrode on said accumulation region.

2. A method of forming a semiconductor substrate, comprising the steps of:

epitaxially forming an in-situ doped JFET region of first conductivity type on a drift region of first conductivity type, said JFET region having a higher net first conductivity type doping concentration therein than said drift region; then selectively implanting first dopants of second conductivity type into said JFET region to define a preliminary deep base region of second conductivity type therein; then epitaxially forming an in-situ doped accumulation region of first conductivity type on said JFET region, said accumulation region having a lower net first conductivity type doping concentration therein than said JFET region; then selectively implanting second dopants of second conductivity type into said accumulation region to define a preliminary shallow base region of second conductivity type therein; and then diffusing the implanted first and second dopants in said JFET region and said accumulation region, respectively, to define a base region having the first and second dopants therein.

3. The method of claim 1, wherein said step of forming base and source regions comprises the steps of forming a shallow base region of second conductivity type in said accumulation region and forming a source region of first conductivity type in said shallow base region.

4. The method of claim 3, wherein said step of forming an insulated gate electrode comprises forming an insulated gate electrode on said source, shallow base and accumulation regions.

5. The method of claim 4, further comprising the step of forming a deep base region of second conductivity type in said JFET region.

6. The method of claim 5, wherein said step of forming an accumulation region is preceded by said step of forming a deep base region.

7. The method of claim 6, wherein said step of forming a shallow base region is preceded by said step of forming a deep base region.

8. The method of claim 7, wherein said step of forming a shallow base region follows said step of epitaxially forming an accumulation region.

9. The method of claim 5, wherein said step of forming a deep base region comprises the steps of performing a selective implant of second conductivity type dopants into said accumulation region and then diffusing the selectively implanted dopants within said accumulation region, prior to said step of forming a shallow base region.

10. The method of claim 6, wherein said step of forming a shallow base region comprises the steps of performing a selective implant of second conductivity type dopants into said accumulation region and then diffusing the selectively implanted dopants within said accumulation region to merge the selectively implanted dopants with said deep base region.

11. The method of claim 5, wherein said step of forming a shallow base region is performed so that said shallow base region forms a P-N junction with said accumulation region, but not with said JFET region; and wherein said step of forming a deep base region is performed so that said deep base region forms a P-N junction with said JFET region.

* * * * *

UNITED STATES PATENT AND TRADEMARK OFFICE
CERTIFICATE OF CORRECTION

PATENT NO. : 5,893,736
DATED : April 13, 1999
INVENTOR(S) : Lee et al.

It is certified that error appears in the above-identified patent and that said Letters Patent is hereby corrected as shown below:

Column 6, line 56, please delete "claim 6" and substitute -- claim 5 -- therefor.

Signed and Sealed this

Eighteenth Day of July, 2000

Attest:

Q. TODD DICKINSON

*Attesting Officer*     *Director of Patents and Trademarks*